US010825921B2

(12) United States Patent
Balakrishnan et al.

(10) Patent No.: US 10,825,921 B2
(45) Date of Patent: Nov. 3, 2020

(54) LATERAL BIPOLAR JUNCTION TRANSISTOR WITH CONTROLLED JUNCTION

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/894,273

(22) Filed: Feb. 12, 2018

(65) Prior Publication Data

US 2018/0166563 A1 Jun. 14, 2018

Related U.S. Application Data

(63) Continuation of application No. 15/211,457, filed on Jul. 15, 2016, now Pat. No. 9,947,778.

(51) Int. Cl.
*H01L 29/735* (2006.01)
*H01L 29/66* (2006.01)
(Continued)

(52) U.S. Cl.
CPC ........ *H01L 29/735* (2013.01); *H01L 21/0242* (2013.01); *H01L 21/02532* (2013.01);
(Continued)

(58) Field of Classification Search
CPC .......... H01L 29/7325; H01L 29/66287; H01L 29/66234; H01L 29/26586; H01L 29/735;
(Continued)

(56) References Cited

U.S. PATENT DOCUMENTS 5,100,810 A 3/1992 Yoshimi et al.
5,298,786 A 3/1994 Shahidi et al.
(Continued)

OTHER PUBLICATIONS

List of IBM Patents or Patent Applications Treated as Related dated Feb. 12, 2018, 2 pages.
(Continued)

*Primary Examiner* — Mohsen Ahmadi
(74) *Attorney, Agent, or Firm* — Tutunjian & Bitetto, P.C.; L. Jeffrey Kelly

(57) ABSTRACT

A method of forming a lateral bipolar junction transistor (LBJT) that includes providing a germanium containing layer on a crystalline oxide layer, and patterning the germanium containing layer stopping on the crystalline oxide layer to form a base region. The method may further include forming emitter and collector extension regions on opposing sides of the base region using ion implantation, and epitaxially forming an emitter region and collector region on the crystalline oxide layer into contact with the emitter and collector extension regions. The crystalline oxide layer provides a seed layer for the epitaxial formation of the emitter and collector regions.

6 Claims, 9 Drawing Sheets

(51) Int. Cl.

| | |
|---|---|
| ***H01L 29/04*** | (2006.01) |
| ***H01L 29/06*** | (2006.01) |
| ***H01L 29/10*** | (2006.01) |
| ***H01L 29/08*** | (2006.01) |
| ***H01L 29/165*** | (2006.01) |
| ***H01L 29/737*** | (2006.01) |
| ***H01L 21/265*** | (2006.01) |
| ***H01L 21/02*** | (2006.01) |
| ***H01L 21/762*** | (2006.01) |
| ***H01L 21/308*** | (2006.01) |
| *H01L 29/73* | (2006.01) |
| *H01L 29/732* | (2006.01) |

(52) U.S. Cl.
CPC .. *H01L 21/02595* (2013.01); *H01L 21/26506* (2013.01); *H01L 21/26586* (2013.01); *H01L 21/3081* (2013.01); *H01L 21/76251* (2013.01); *H01L 29/04* (2013.01); *H01L 29/0649* (2013.01); *H01L 29/0684* (2013.01); *H01L 29/0808* (2013.01); *H01L 29/0821* (2013.01); *H01L 29/1008* (2013.01); *H01L 29/165* (2013.01); *H01L 29/6625* (2013.01); *H01L 29/66242* (2013.01); *H01L 29/737* (2013.01); *H01L 29/0804* (2013.01); *H01L 29/7317* (2013.01); *H01L 29/7322* (2013.01); *H01L 29/7325* (2013.01); *H01L 29/7375* (2013.01)

(58) Field of Classification Search
CPC ................... H01L 29/73; H01L 29/068; H01L 2924/1305; H01L 29/0804; H01L 29/66303; H01L 29/7322; H01L 29/7375
See application file for complete search history.

(56) References Cited

U.S. PATENT DOCUMENTS

| | | | | |
|---|---|---|---|---|
| 5,936,278 | A | 8/1999 | Hu et al. | |
| 6,051,452 | A | 4/2000 | Shigyo et al. | |
| 6,610,548 | B1 | 8/2003 | Ami et al. | |
| 6,852,575 | B2 | 2/2005 | Bojarczuk, Jr. et al. | |
| 7,135,699 | B1 | 11/2006 | Atanackovic | |
| 8,288,758 | B2 | 10/2012 | Ning et al. | |
| 8,420,493 | B2 | 4/2013 | Ning et al. | |
| 8,441,084 | B2 | 5/2013 | Cai et al. | |
| 9,059,016 | B1 | 6/2015 | Hekmatshoar-Tabari et al. | |
| 9,059,232 | B2 * | 6/2015 | Cheng | H01L 29/737 |
| 9,318,585 | B1 | 4/2016 | Cai et al. | |
| 9,425,260 | B2 * | 8/2016 | Chan | H01L 29/155 |
| 9,437,718 | B1 | 9/2016 | Cai et al. | |
| 9,502,504 | B2 * | 11/2016 | Cai | H01L 27/1203 |
| 9,536,788 | B1 * | 1/2017 | Ning | H01L 21/8228 |
| 9,634,142 | B1 | 4/2017 | Schepis et al. | |
| 9,659,979 | B2 | 5/2017 | Gordon et al. | |
| 9,673,307 | B1 * | 6/2017 | Chan | H01L 21/02595 |
| 9,761,608 | B1 | 9/2017 | Balakrishnan et al. | |
| 9,799,756 | B1 | 10/2017 | Chan et al. | |
| 9,852,938 | B1 | 12/2017 | Chan et al. | |
| 9,929,258 | B1 | 3/2018 | Hashemi et al. | |
| 9,947,778 | B2 | 4/2018 | Balakrishnan et al. | |
| 10,141,405 | B2 | 11/2018 | Chan et al. | |
| 10,396,154 | B2 | 8/2019 | Chan et al. | |
| 2002/0089038 | A1 | 7/2002 | Ning | |
| 2003/0057491 | A1 | 3/2003 | Mitani et al. | |
| 2004/0180519 | A1 | 9/2004 | Schwarzenbach et al. | |
| 2005/0250294 | A1 | 11/2005 | Ghyselen | |
| 2006/0060941 | A1 | 3/2006 | Sun et al. | |
| 2006/0128117 | A1 | 6/2006 | Ghyselen et al. | |
| 2008/0111186 | A1 | 5/2008 | Atanackovic | |
| 2008/0135924 | A1 | 6/2008 | Lebby et al. | |
| 2009/0236595 | A1 * | 9/2009 | Atanackovic | H01L 21/28194 257/43 |
| 2009/0309167 | A1 | 12/2009 | Russ et al. | |
| 2010/0213548 | A1 | 8/2010 | Chang et al. | |
| 2011/0303950 | A1 | 12/2011 | Lauer et al. | |
| 2012/0049282 | A1 | 3/2012 | Chen et al. | |
| 2012/0139009 | A1 * | 6/2012 | Ning | H01L 29/0808 257/197 |
| 2012/0235151 | A1 | 9/2012 | Cai et al. | |
| 2013/0256757 | A1 * | 10/2013 | Cai | H01L 29/42304 257/197 |
| 2013/0260526 | A1 | 10/2013 | Cai et al. | |
| 2013/0313551 | A1 * | 11/2013 | Hekmatshoar-Tabari | H01L 29/737 257/51 |
| 2014/0088401 | A1 | 3/2014 | Cal et al. | |
| 2014/0167163 | A1 | 6/2014 | Cheng et al. | |
| 2014/0354347 | A1 | 12/2014 | Chi et al. | |
| 2014/0357043 | A1 | 12/2014 | Cai et al. | |
| 2014/0367782 | A1 | 12/2014 | Cheng et al. | |
| 2015/0179778 | A1 | 6/2015 | Cai et al. | |
| 2015/0236093 | A1 * | 8/2015 | Chan | H01L 29/66272 257/565 |
| 2015/0263091 | A1 | 9/2015 | Hashemi et al. | |
| 2015/0318377 | A1 | 11/2015 | Cheng et al. | |
| 2016/0380087 | A1 | 12/2016 | Liu | |
| 2018/0019330 | A1 | 1/2018 | Balakrishnan et al. | |
| 2018/0040723 | A1 | 2/2018 | Chan et al. | |
| 2019/0165150 | A1 | 5/2019 | Hashemi et al. | |
| 2019/0371923 | A1 | 12/2019 | Hashemi et al. | |

OTHER PUBLICATIONS

U.S. Office Action issued in U.S. Appl. No. 16/502,271, dated Apr. 1, 2020, pp. 1-53.
List of IBM Patents or Patent Applications Treated as Related dated Mar. 13, 2020, 2 pages.

* cited by examiner

LATERAL BIPOLAR JUNCTION TRANSISTOR WITH CONTROLLED JUNCTION

BACKGROUND

Technical Field

The present disclosure relates to a bipolar junction transistor (BJT) structure, and more particularly to lateral bipolar junction transistors.

Description of the Related Art

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

SUMMARY

In one aspect, the present disclosure provides a lateral bipolar junction transistor (LBJT) that includes a crystalline oxide underlying at least the emitter and collector regions of the device. The crystalline oxide facilitates control of the junction positioning in the formation of lateral bipolar junction transistors (LBJT). In one embodiment, the lateral bipolar junction transistor (LBJT) includes a crystalline oxide layer; and a base region comprised of a germanium containing material in bonded engagement to the crystalline oxide layer. The lateral bipolar junction transistor may further include an emitter region and collector region present on opposing sides of the base region, the emitter region and collector region being in an epitaxial relationship with the crystalline oxide layer. In one embodiment, the lateral bipolar junction transistor further includes a junction region between each of the emitter region and the collector region and the base region, wherein the junction region has a dopant conductivity equal to the emitter and the collector region, and a vertical dopant concentration in said junction region is substantially uniform.

In another aspect of the present disclosure, a method is provided in which a crystalline oxide underlying at least the emitter and collector regions of the device facilitates positioning of the junction in a lateral bipolar junction transistors (LBJT). In one embodiment, the method of forming a lateral bipolar junction transistor (LBJT) includes providing a germanium containing layer on a crystalline oxide layer, and patterning the germanium containing layer stopping on the crystalline oxide layer to form a base region. Emitter and collector extension regions are formed on opposing sides of the base region using ion implantation. Thereafter, the emitter region and the collector region are epitaxially formed on the crystalline oxide layer into contact with the emitter and collector extension regions.

In another embodiment, the method of forming a lateral bipolar junction device may include providing a germanium containing layer on a crystalline oxide layer, and forming an extrinsic base region on the germanium containing layer. A spacer may be formed on the sidewalls of the extrinsic base region. The germanium containing layer may be etched using the extrinsic base region and said spacer as a mask with an etch that is selective to the crystalline oxide layer to form a base region. In a following process step, emitter and collector extension regions may be formed on opposing sides of the base region using angled ion implantation. An emitter region and collector region may be epitaxially formed on the crystalline oxide layer in contact with the emitter and collector extension regions.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1A:
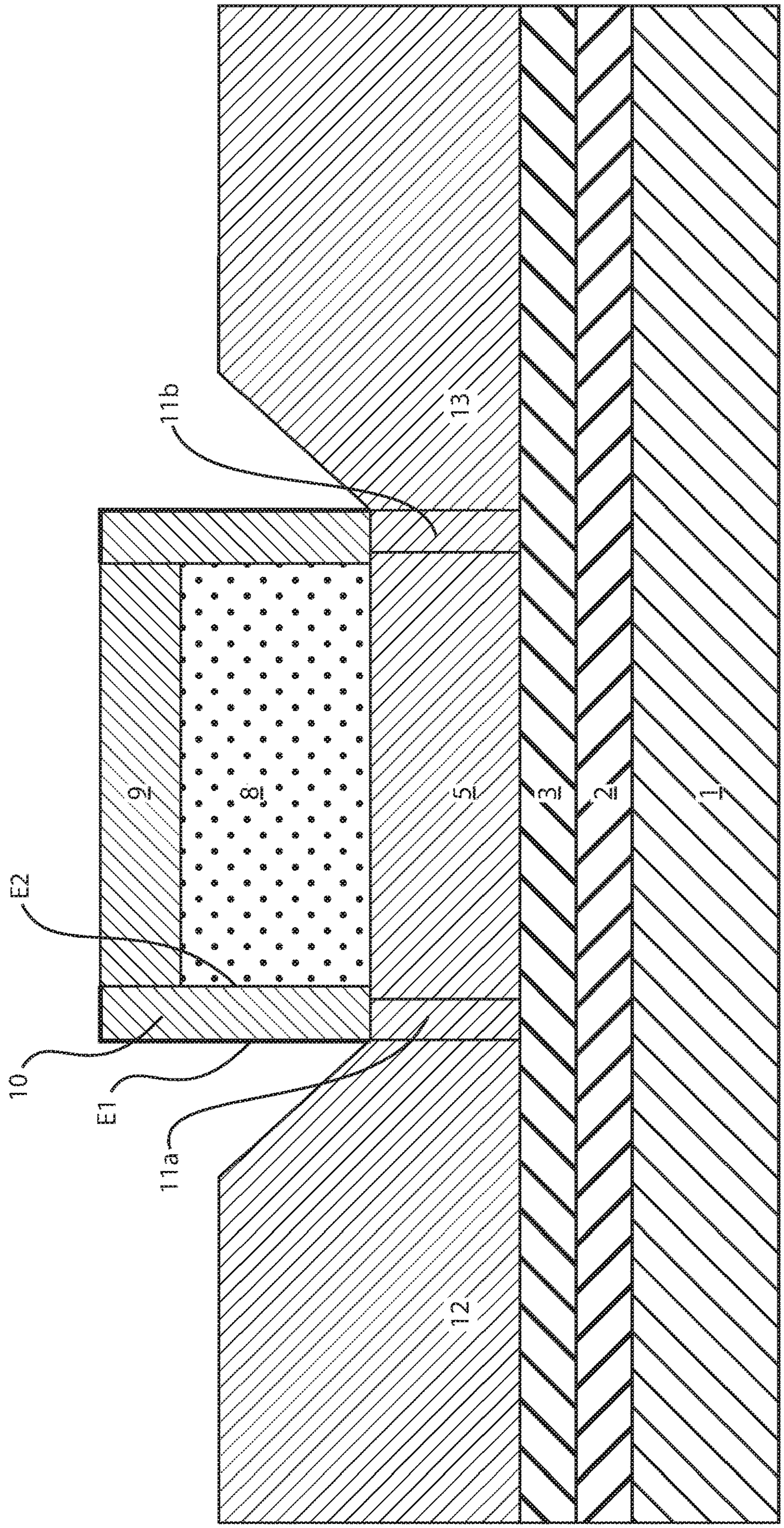
FIG. 1A is a side cross-sectional view of a lateral bipolar junction transistor (LBJT) device that includes a germanium containing base that is overlying a crystalline oxide layer, and emitter and collector regions that are also formed on the crystalline oxide layer, in which the emitter and collector regions may be composed of epitaxial semiconductor material having a facetted growth, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes is a semiconductor device formed by two P-N junctions whose function is amplification of an electric current. Bipolar transistors are made from 3 sections of semiconductor material, i.e., alternating P-type and N-type conductivity semiconductor materials, with two resulting P-N junctions. As will be described in greater detail below the (BJT) devices disclosed herein are lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed.

The present disclosure provides lateral bipolar junction transistors (LBJT), and methods of forming lateral bipolar junction transistor (LBJT) devices including germanium containing semiconductor materials. Germanium is a candidate for lateral bipolar junction transistors and can offer high cut off frequency for both NPN and PNP types. In some scenarios, controlling the collector/emitter (C/E) doping with ion implantation can be difficult due to depth control of the implantation, which usually results in non-uniform lateral and vertical dopant profiles. In some prior methods, junction control may be practiced using facetted epitaxial growth on the collector/emitter regions followed by recess etching and regrowth of epitaxial semiconductor material. In the methods and structures disclosed herein, a method of junction control is taught, in which the semiconductor on insulator (SOI) layer, i.e., silicon (Si) on insulator or germanium (Ge) on insulator, is formed using a crystalline oxide. Contrary to amorphous materials that do not have a regular lattice structure, crystalline oxides have a regular lattice structure, or a set array of anions and cations. As will be described in further detail below, in some embodiments of the methods and structures disclosed herein, the channel/base regions of the LBJT may be patterned using an etch process that stops on the crystalline oxide. Thereafter, following spacer formation, junctions can be formed using angled ion implantation and epitaxial growth. The surface of the crystalline oxide that is exposed during the etch step that patterns the channel/base provides the epitaxial growth surface, i.e., seed surface, for growing the epitaxial semiconductor material for the emitter and collector regions of the LBJT device. The methods and structures of the present disclosure are now described with greater detail with reference to FIGS. 1-8.

Figure 1B:
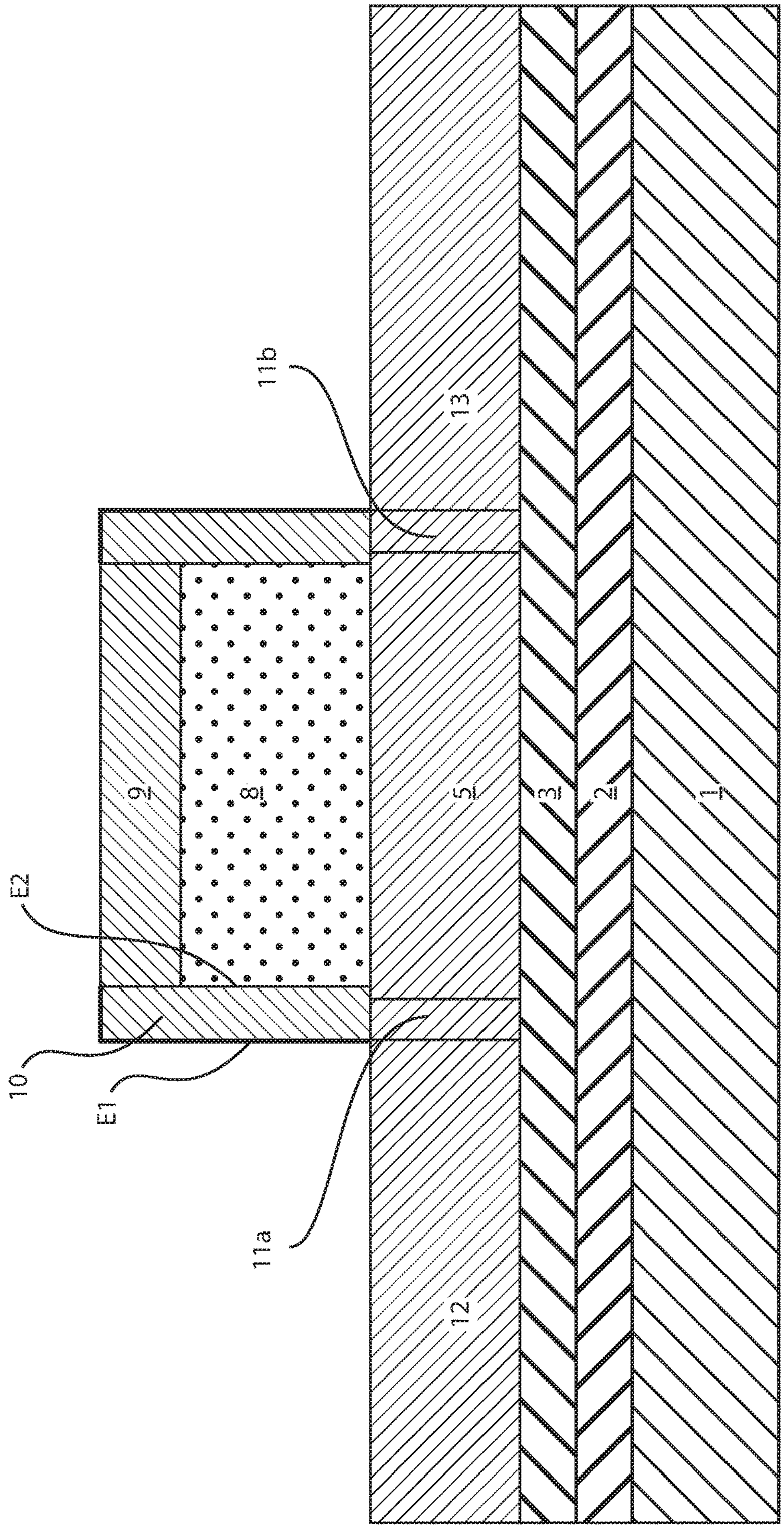
FIG. 1B is a side cross-sectional view of a lateral bipolar junction transistor (LBJT) device that includes a germanium containing base that is overlying a crystalline oxide layer, and emitter and collector regions that are also formed on the crystalline oxide layer, in which the emitter and collector regions may be composed of epitaxial semiconductor material having a non-facetted growth, in accordance with one embodiment of the present disclosure.

FIGS. 1A and 1B depict some embodiments of an LBJT device 100 that includes a crystalline oxide layer 3 that is underlying the base region 5, the emitter region 12 and the collector region 13. The crystalline oxide layer 3 may be a single continuous layer that continuously extends beneath each of the base region 5, emitter region 12 and the collector region 13 without any breaks or discontinuations in the layer. In one embodiment, the crystalline oxide layer 3 may be composed of hafnium oxide ($HfO_2$). The crystalline oxide layer 3 may also be composed of cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$) or combinations thereof. It is noted that the above compositions are provided for illustrative purposes only, and are not intended to limit the present disclosure. For example, the crystalline oxide layer 3 may also be composed of other rare earth containing metal oxides. In some embodiments, the rare earth metal of the epitaxial oxide layer 10 is selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof. Exemplary are earth oxides may include cerium oxide ($CeO_2$), lanthanum oxide ($La_2O_3$), yttrium oxide ($Y_{203}$), gadolinium oxide ($Gd_2O_3$), europium oxide ($Eu_2O_3$), and terbium oxide ($Tb_2O_3$)). In some embodiments, the epitaxial oxide layer 10 includes combinations of rare earth oxides (e.g., a material such as $ABO_3$, where 'A' and 'B' may be any rare earth metal (e.g., lanthanum scandium oxide ($LaScO_3$)). In yet another embodiment, epitaxial oxide layer 10 may include aluminum oxide $Al_2O_3$ or aluminum oxide compounds (e.g., lanthanum aluminum $LaAlO_3$). In some examples, the epitaxial oxide layer 10 is selected from the group consisting of $(La_xY_{1-x})_2O_3$, $CeO_2$, and combinations thereof.

In some embodiments, the crystalline oxide layer 3 functions as an etch stop layer in patterning the base region 5, and functions as a seed layer in forming the epitaxial emitter region 12 and the epitaxial collector region 13. The thickness of the crystalline oxide layer 3 may be selected to function as an etch stop layer, and also to function as seed layer for the epitaxial growth of the emitter and collector regions 12, 13. The crystalline oxide layer 3 may have a thickness ranging from 1 nm to 100 nm. In other embodiments, the crystalline oxide layer 3 may have a thickness ranging from 2 nm to 75 nm. In yet other embodiments, the crystalline oxide layer 3 may have a thickness ranging from 5 nm to 25 nm. It is noted that the above examples are provided for illustrative purposes only, and are not intended to limit the present disclosure.

By employing the crystalline oxide layer 3 as an etch stop layer to pattern the base region 5, the sidewalls of the base region 5 are exposed for implanting junctions by ion implantation, i.e., angled ion implantation. This provides a high concentration of n-type or p-type dopant in the junction and a substantially uniform lateral and vertical dopant profile not provided by prior methods.

The base region 5 may be composed of any germanium containing material. One example of germanium containing materials that are suitable for the base region 5 include germanium (Ge), e.g., single crystal germanium (c-Ge). Another example of a germanium containing material for the base region is silicon germanium (SiGe), e.g., single crystal silicon germanium (c-SiGe). In other embodiments, the base region 5 may also be composed of a type III-V semiconductor material or a silicon containing material, such as silicon (Si). The base region 5 is the region within the lateral bipolar junction transistor (LBJT) where a sufficient input current triggers a larger current from the emitter 12 to the collector 13 of the transistor. The role of the base region 5 is to function as an amplifier causing an emitter-to-collector current to be much larger than the base current. When the base receives an input current, a larger current then flows from the emitter region 12 to the collector region 13. In a bipolar junction transistor, current flows from the emitter region 12 to the collector region 13 and then out from the collector region 13.

The base region 5 of the transistor has an opposite polarity, i.e., conductivity type, from the emitter region 12 and the collector region 13. The term "conductivity type" means that a region is either doped to an n-type conductivity or a p-type conductivity. For example, when the base region 5 is doped to an n-type conductivity, the emitter region 12 and the collector region 13 are doped to a p-type conductivity, and the transistor is referred to as a PNP bipolar transistor. In another example, when the base region 5 is doped to a p-type conductivity, the emitter region 12 and the collector region 13 are doped to an n-type conductivity, and the transistor is referred to as an NPN bipolar transistor.

The base region 5 is directly on the crystalline oxide layer 3. As will be described below, the base region 5 is formed from a semiconductor layer that is bonded to the crystalline oxide layer 3. Therefore, a lattice match is not present at the interface of the base region 5 and the crystalline oxide layer 3. The bonded interface between the base region 5 and the crystalline oxide layer 3 may be provided by a thermal bond, adhesive bond, or a combination thereof. In some embodiments, the interface between the base region 5 and the crystalline oxide 3 may be characterized by a lattice mismatch. In some embodiment, the base region 5 may be totally relaxed. As noted above, the crystalline oxide layer 3 functions as an etch stop layer in the patterning of the base region 5. More specifically, an extrinsic base region 8 is first patterned and etched atop the base region 5. Spacers 10 are then formed on the sidewalls of the extrinsic base region 8. Using the extrinsic base region 8 and spacers as an etch mask, the material layer that provides the base region 5 is then etched selectively to the underlying crystalline oxide layer 3.

This exposes the sidewalls of the base region 5 that are substantially aligned with the spacers and extrinsic base region 8 for forming the junctions 11*a*, 11*b*. The appropriate n-type or p-type dopant is then ion implanted using angled ion implantation into the exposed sidewall of the base region 5. For example, the LBJT device 100 that is depicted in FIGS. 1A and 1B may include junctions, i.e., emitter extension regions 11*a*, being present between the emitter region 12 and the base region 5 on one side of the device, and the collector extension region 11*b* present between the base region 5 and the collector region 13 on the opposing side of the device. The dopant concentration in the junctions 11*a*, 11*b* ranges from $1\times10^{19}$ $cm^{-3}$ to $1\times10^{21}$ $cm^{-3}$.

Because the dopant, i.e., n-type or p-type dopant, is implanted directly into the exposed sidewalls of the base region 5 that are aligned with the extrinsic base region 8 and spacers 10, the junctions 11*a*, 11*b* have a uniform dopant concentration, i.e., uniform lateral and vertical dopant gradient. For example, each of the emitter extension region 11*a* and the collector extension region 11*b* may are substantially aligned with an outer edge E1 of an overlying spacer 10 and does not extend beyond an inner edge E2 of the spacer 10. The emitter extension region 11*a* and the collector extension region 11*b* may extend from the outer edge E1 towards the base 5 at an abrupt dopant concentration gradient of n-type or p-type dopants of 5 nm per decade or less, e.g., 4 nm per decade or less.

Still referring to FIGS. 1A and 1B, the emitter region 12 and collector region 13 are present on opposing sides of the base region 5. The emitter region 12 and collector region 13 are epitaxially formed semiconductor materials in an epitaxial relationship with the crystalline oxide layer 3. The term "epitaxial" denotes that a material is formed using an epitaxial growth process. The terms "epitaxial growth and/or deposition" and "epitaxially formed" mean the growth of a material, such as a semiconductor or dielectric, on a deposition surface of a semiconductor material, in which the material being grown has the same crystalline characteristics, e.g., crystalline plane orientation, as the semiconductor material of the deposition surface. For example, the emitter region 12 and collector region 13 may have the same orientation crystal plane as the crystalline oxide 3. For example, both the crystalline oxide layer 3 and the emitter/collector regions 12, 13 may have the orientation of a (100) crystal plane. In other embodiments, both the crystalline oxide layer 3 and the emitter/collector regions 12, 13 may have the orientation of a (110) crystal plane. By lattice matched it is meant that the material of the crystalline oxide layer 10 and the emitter/collector regions 12, 13 have substantially the same lattice dimension. In some embodiments, the emitter/collector regions 12, 13 may be under a tensile or compressive stress.

The emitter region 12 and collector region 13 may be composed of polycrystalline silicon, polycrystalline germanium, polycrystalline silicon germanium, single crystalline germanium or single crystalline silicon germanium. The material that is selected for the semiconductor material of the emitter region 12 and the collector region 13 may have a larger band gap than the base region 5. The term "band gap" refers to the energy difference between the top of the valence band (i.e., EV) and the bottom of the conduction band (i.e., EC). For example, in some embodiments, to provide that the emitter and collector region 12, 13 have a larger band gap than the base region, when the base region 5 is composed of p-type doped germanium (Ge), the emitter and collector regions 12, 13 may be composed of n-type doped silicon germanium (SiGe).

Referring to FIG. 1A, in some embodiments, the emitter and collector regions 12, 13 may be composed of facetted epitaxially grown semiconductor material. By facetted it is meant that the epitaxial grown is preferentially along a specific crystalline plane, such as along the (111) or (110) plane. This may result in a pyramid upper surface geometry. Referring to FIG. 1B, in some embodiments, the epitaxially grown semiconductor material that provides the emitter and collector regions 12, 13 is non-facetted. This typically results in a material layer that does not include the pyramid geometry provided by facetted growth.

Still referring to FIG. 1, the LBJT device 100 may further include an extrinsic base region 8 that is present atop the base region 5. The extrinsic base region 8 is typically formed of a silicon or germanium containing semiconductor material, such as silicon, single crystal silicon, polycrystalline silicon, polycrystalline germanium, polycrystalline silicon germanium, single crystal germanium, single crystal silicon germanium and combinations thereof. The extrinsic base region 8 is typically doped to a same conductivity type as the base region 5. For example, if the base region 5 is doped to an n-type conductivity, the extrinsic base region 8 is also doped to an n-type conductivity. The dopant concentration of the dopant that dictates the conductivity type of the extrinsic base region 8 is typically greater than the dopant concentration that dictates the conductivity type of the base region 5. For example, the dopant concentration of the n-type or p-type dopant in the extrinsic base region 8 may range from $4\times10^{19}$ atoms/cm$^3$ to $6\times10^{21}$ atoms/cm$^3$. In another example, the dopant concentration of the n-type or p-type dopant in the extrinsic base region 8 may range from $1\times10^{2o}$ atoms/cm$^3$ to $1\times10^{21}$ atoms/cm$^3$. The extrinsic base region 8 is present within the width of the base region 5.

Spacers 10 of a dielectric material, such as an oxide, nitride, oxynitride material or low-k dielectric material, are present on the sidewalls of the extrinsic base region 8. Examples of materials suitable for low-k dielectric spacers 10 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. A hard mask 9 may be present atop the extrinsic base region 5, and may be composed of an oxide, nitride or oxynitride material. For example, the hard mask 9 can be composed of silicon nitride.

The LBJT device that is depicted in FIG. 1 may be present on a semiconductor substrate 1 composed of a type III-V semiconductor material or type IV semiconductor material. The semiconductor substrate 1 is typically composed of a single crystalline material. Examples of type IV semiconductor materials for the semiconductor substrate 1 include silicon (Si), germanium (Ge) and silicon germanium (Ge). The semiconductor substrate 1 may also be composed of indium phosphide (InP) or indium phosphide (InP) on silicon (Si). Other III-V semiconductor materials that can provide the semiconductor substrate may include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof.

In some embodiments, a buried oxide layer 2, such as a buried oxide layer composed of silicon oxide ($SiO_2$), may be present between the semiconductor substrate 1 and the crystalline oxide layer 3. The buried oxide layer 2 may have a thickness ranging from 20 nm to 200 nm.

Figure 2:
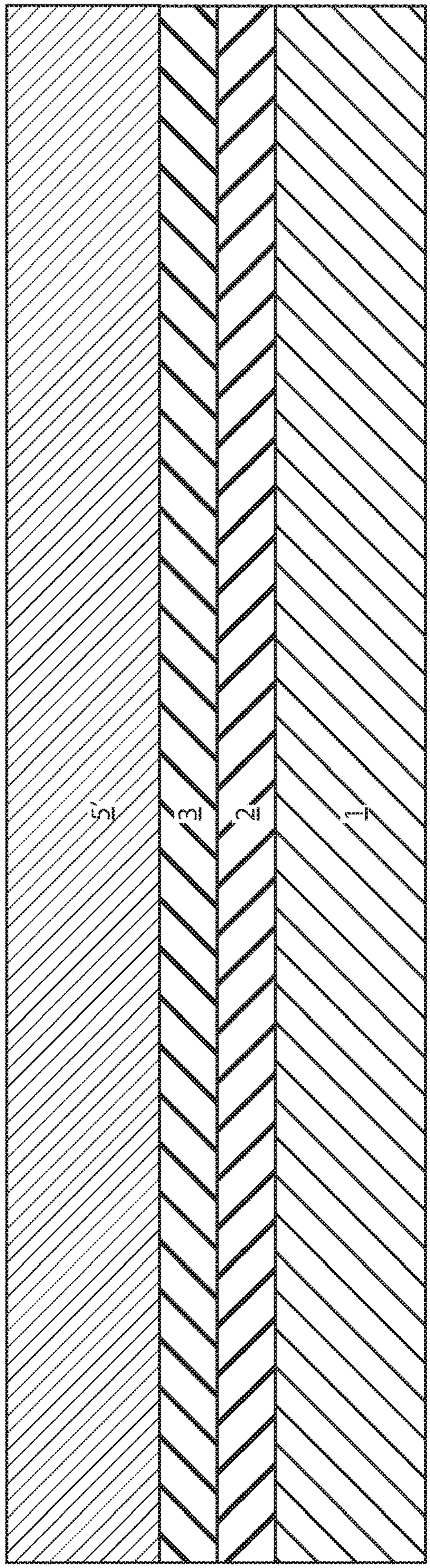
FIG. 2 is a side cross-sectional view depicting one embodiment of a substrate structure that may be used to form a lateral bipolar junction transistor (LBJT) that includes a material stack of a germanium containing material, a crystalline oxide layer, a buried oxide layer and a base supporting substrate, in accordance with one embodiment of the present disclosure.

FIGS. 2-9 depict one embodiment of a method for forming the LBJT devices 100 depicted in FIGS. 1A and 1B. FIG. 2 depicts one embodiment of an initial structure for forming a lateral bipolar junction transistor (LBJT). FIG. 2 depicts one embodiment of a substrate structure that includes a material stack of a silicon containing, germanium containing or type III-V semiconductor material 5', a crystalline oxide layer 3, a buried oxide layer 3, and a supporting substrate 1. As will be described below, the germanium containing material layer, silicon containing material layer or type III-V semiconductor material layer 5' provides the base region 5 of the LBJT device, as depicted in FIG. 1.

Therefore, the above description of the composition for the base region 5 depicted in FIG. 1 is suitable for describing at least one example of the germanium containing material layer, silicon containing material or type III-V semiconductor material layer 5' that is depicted in FIG. 2. Similarly, the crystalline oxide layer 3, the buried oxide layer 3, and the supporting substrate 1 that are depicted in FIG. 2 have been described above with reference to FIG. 1.

Figure 3C:
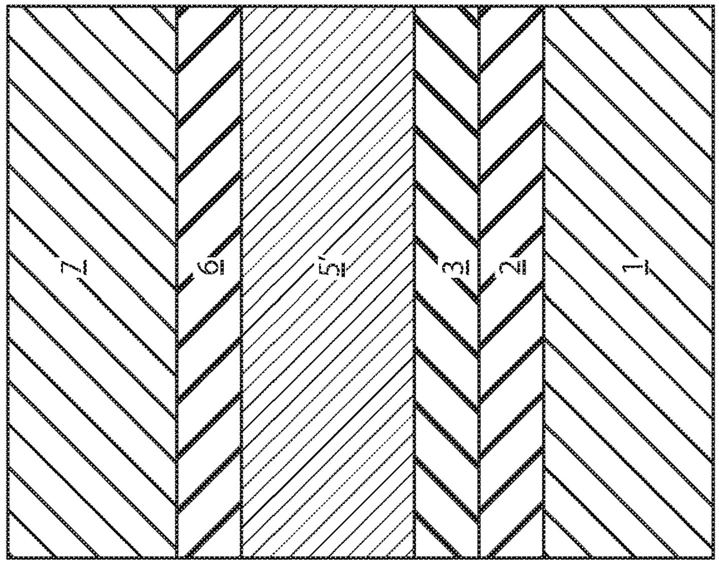
FIG. 3C is a side cross-sectional view depicting bonding the first substrate component depicted in FIG. 3A to the second substrate component depicted in FIG. 3B, in accordance with one embodiment of the present disclosure.
Figure 3B:
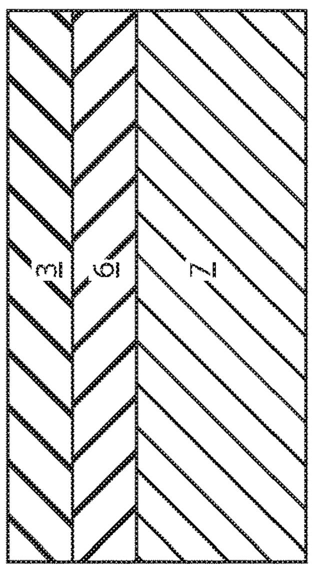
FIG. 3B is a side cross-sectional view of a second substrate component for use with the first substrate component depicted in FIG. 3A for forming the substrate structure depicted in FIG. 2 by bonding techniques, in accordance with one embodiment of the present disclosure.
Figure 3A:
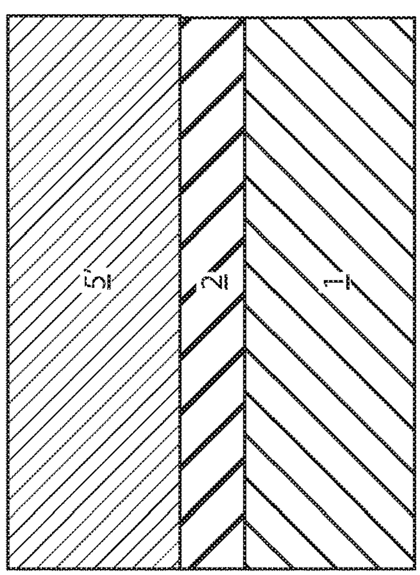
FIG. 3A is a side cross-sectional view of one substrate component for use in forming the substrate structure depicted in FIG. 2 using bonding methods, in accordance with one embodiment of the present disclosure.

The substrate structure depicted in FIG. 2 may be formed using bonding methods, such as the bonding sequence depicted in FIGS. 3A-3C. FIG. 3A depicts one embodiment of a first substrate component for use in forming the substrate structure depicted in FIG. 2 using bonding methods. The first substrate component may include a material stack that includes the base semiconductor substrate 1, the buried oxide layer 2 present on the semiconductor substrate 1, and the germanium containing material layer, silicon containing material or type III-V semiconductor material layer 5'. The buried oxide layer 2 may be formed on the base semiconductor substrate 1 using a deposition method, such as chemical vapor deposition, e.g., plasma enhanced chemical vapor deposition (PECVD), or may be formed using a thermal growth process, e.g., thermal oxidation. The germanium containing material layer, silicon containing material or type III-V semiconductor material layer 5' may be formed on the buried oxide layer 2 using chemical vapor deposition. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof. Because the germanium containing material layer, silicon containing material or type III-V semiconductor material layer 5' is processed to provide the base region 5 of the lateral bipolar junction transistor (LBJT) device, the germanium containing material layer, silicon containing material or type III-V semiconductor material layer 5' is doped to an n-type or p-type conductivity depending upon whether the LBJT device is a PNP or an NPN device. The dopant that dictates the conductivity type of the germanium containing material layer, silicon containing material or type III-V semiconductor material layer 5' may be introduced using ion implantation or in situ doping. The term "in situ" denotes that the dopant that dictates the conductivity type of a material is introduced while the material is being formed, e.g., during an epitaxial growth process.

FIG. 3B depicts one embodiment of a second substrate component for use with the first substrate component depicted in FIG. 3A for forming the substrate structure depicted in FIG. 2 through bonding techniques. The second substrate component may include a handling substrate 7, a sacrificial buried oxide layer 6, and the crystalline oxide layer 3. The crystalline oxide layer 3 has been described above with reference to FIGS. 1A and 1B. Referring to FIG. 3B, the handling substrate 7 may be composed of any material that can support the aforementioned material stack as part of the bonding process during the method for forming the structure depicted in FIG. 2, which may include dielectric, semiconductor or metal materials. For example, the handling substrate 7 may be composed of silicon (Si). The sacrificial buried oxide layer 6 may be deposited on the handling substrate 7 using a chemical vapor deposition (CVD) process. In some examples, the sacrificial buried oxide layer 6 may be composed of silicon oxide ($SiO_2$). The crystalline oxide layer 3 may be formed on the sacrificial buried oxide layer 6 using a deposition process, such as chemical vapor deposition (CVD), e.g., plasma enhanced chemical vapor deposition (PECVD), or the germanium containing or type III-V semiconductor material layer 5' may be transferred to the surface of the sacrificial buried oxide layer 6 using bonding techniques and layer transfer techniques. Further details regarding the formation of the crystalline oxide layer 3 may be found in U.S. Pat. Nos. 7,135,699, 6,852,575 and 6,610,548, which may be incorporated herein in their entirety by reference.

FIG. 3C depicts bonding the first substrate component depicted in FIG. 3A to the second substrate component depicted in FIG. 3B. More specifically, in one embodiment, the exposed surface of the germanium containing material layer, silicon containing material or type III-V semiconductor material layer 5' from the first substrate component is contacted to the exposed surface of the crystalline oxide layer 3 of the second substrate component under temperature and pressure to form a thermal bond that connects the first substrate component to the second substrate component. In other embodiments, adhesive bonding may be used to engage the exposed surface of the crystalline oxide layer 3 from the second substrate component is contacted to the exposed surface of the germanium containing material layer, silicon containing material or type III-V semiconductor material layer 5' of the first substrate component to provide the structure depicted in FIG. 3C. Following bonding, the handling substrate 7 and the sacrificial buried oxide layer 6 may be removed using selective etching, e.g., reactive ion etch, plasma etching or planarization, e.g., chemical mechanical planarization, to provide the substrate structure depicted in FIG. 2.

Figure 4:
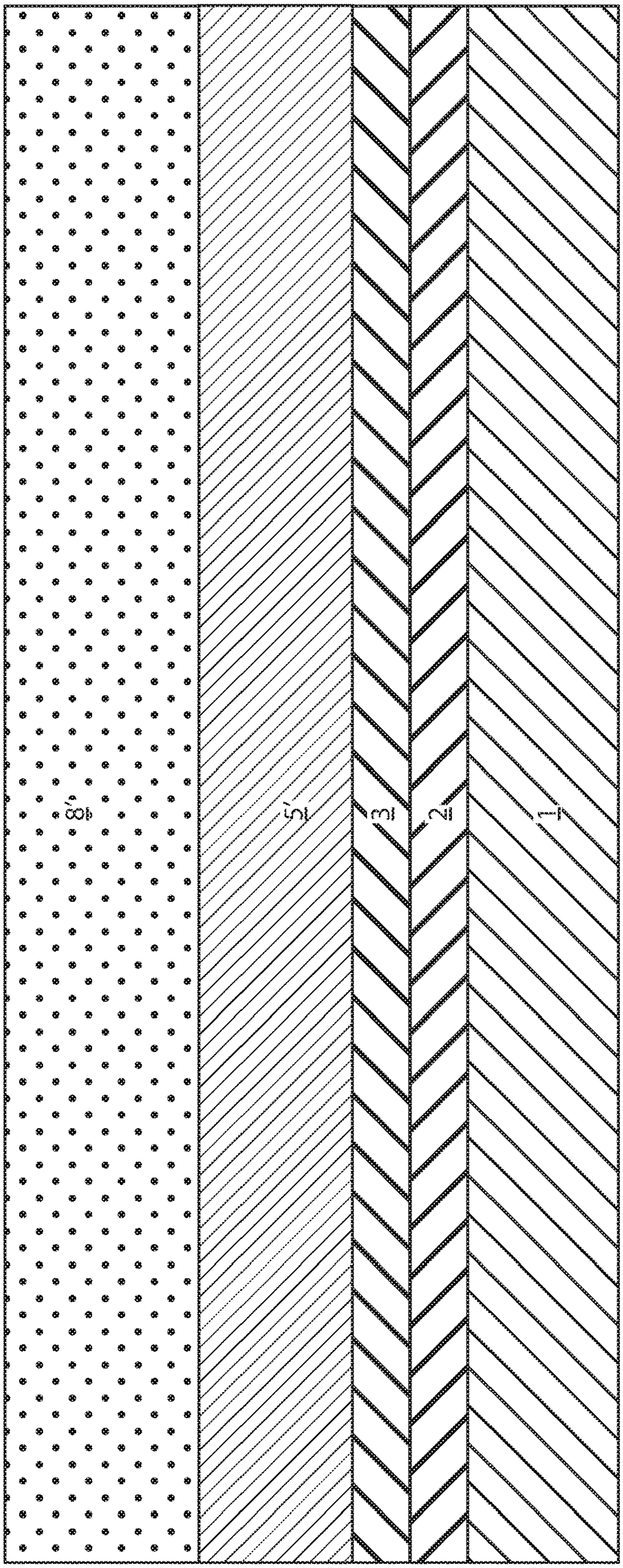
FIG. 4 is a side cross-sectional view depicting forming a material layer for an extrinsic base region of the lateral bipolar junction transistor (LBJT) device on the substrate depicted in FIG. 2, wherein the extrinsic base region includes doped polycrystalline silicon germanium (SiGe) or doped polycrystalline silicon (Si), in accordance with one embodiment of the present disclosure.

FIG. 4 depicts one embodiment of forming a material layer 8' for an extrinsic base region 8 of the LBJT device on the substrate depicted in FIG. 2, wherein the extrinsic base region 8 may be composed of doped polycrystalline silicon germanium (SiGe), doped polycrystalline germanium (Ge), or doped polycrystalline silicon (Si). The material layer 8' for an extrinsic base region 8 is typically formed atop the germanium containing, silicon containing or type III-V semiconductor material 5'. The material layer 8' for the extrinsic base region 8 may be formed using chemical vapor deposition (CVD). Variations of CVD processes suitable for this stage of the process flow disclosed herein may include, but is not limited to, Atmospheric Pressure CVD (APCVD), Low Pressure CVD (LPCVD), Plasma Enhanced CVD (PECVD), Metal-Organic CVD (MOCVD) and combinations thereof. The material layer 8' for an extrinsic base region 8 of the LBJT device is typically doped to the same conductivity type as the germanium containing, silicon containing or type III-V semiconductor material 5' that provides the base region 5, but the concentration of the n-type or p-type dopant that is present in the material layer 8' for an extrinsic base region 8 is typically greater than the dopant concentration of the n-type or p-type dopant in the germanium containing, silicon containing or type III-V semiconductor material 5' that provides the base region 5 of the LBJT. In one example, when the concentration of the n-type or p-type dopant in the base region 5 ranges from $1\times10^{17}$ atoms/$cm^3$ to $3\times10^{19}$ atoms/$cm^3$, the concentration of the n-type or p-type dopant in material layer 8' for an extrinsic base region 8 may range from $1\times10^{19}$ atoms/$cm^3$ to $5\times10^{21}$ atoms/$cm^3$. In another example, when the concentration of the n-type or p-type dopant in the base region 5 ranges from $1\times10^{18}$ atoms/$cm^3$ to $5\times10^{18}$ atoms/$cm^3$, the concentration of the n-type or p-type dopant in material layer 8' for an extrinsic base region 8 may range from $1\times10^{20}$ atoms/$cm^3$ to $1\times10^{21}$ atoms/$cm^3$. The dopant may be implanted in situ, by ion implantation, or by gas phase doping. The thickness for the material layer 8' for an extrinsic base region 8 of the LBJT device may range from 5 nm to 1000 nm.

Figure 5:
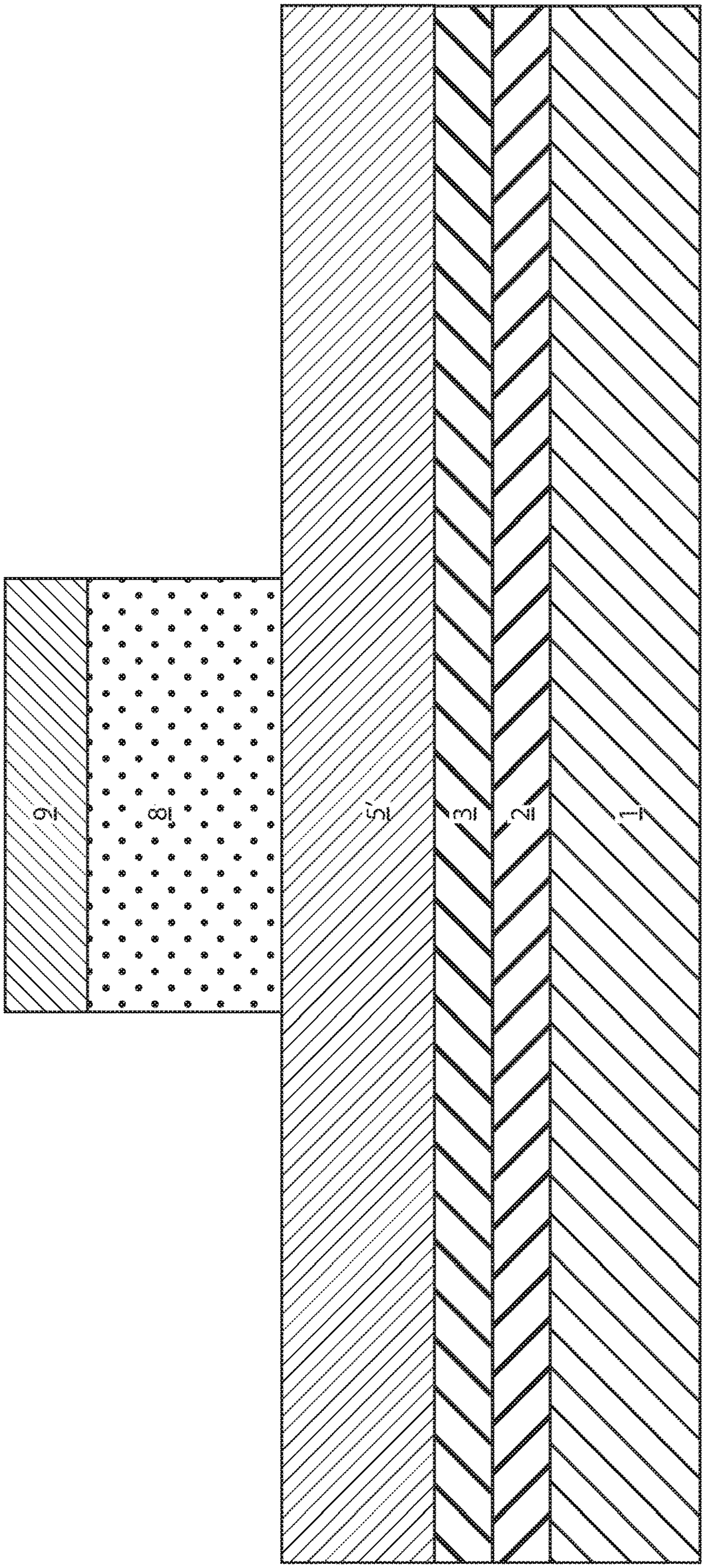
FIG. 5 is a side cross-sectional view depicting forming a hardmask on the material layer for the extrinsic base region of the LBJT device, and patterning the material layer for the extrinsic base region of the LBJT device, in accordance with one embodiment of the present disclosure.

FIG. 5 depicts one embodiment of forming a hardmask 9 on the material layer 8' for the extrinsic base region 8 of the LBJT device, and patterning the material layer 8' to provide the extrinsic base region 8 of the LBJT device. Forming a hardmask 9 may begin with depositing a dielectric layer on the upper surface of the material layer 8' for the extrinsic base region 8. The dielectric layer that provides the hardmask 9 may be composed of an oxide, nitride, oxynitride, metal oxide or combination thereof. For example, when the hardmask 9 is composed of a nitride, the nitride may be provided by silicon nitride. The material layer for the hardmask 9 may be blanket deposited using chemical vapor deposition, e.g., plasma enhanced chemical vapor deposition (PECVD). The dielectric layer may then be patterned using photolithography and etch process, which can begin with forming a photoresist block mask. A photoresist block mask can be produced by applying a photoresist layer, exposing the photoresist layer to a pattern of radiation, and then developing the pattern into the photoresist layer utilizing conventional resist developer. The portions of the dielectric layer that are protected by the photoresist block mask remain to provide the hardmask 9, and the portions of the dielectric layer that are not protected by the photoresist block mask are removed by an etch process. The etch process for removing the exposed portions of the dielectric layer in patterning the hardmask 9 may be an anisotropic etch, such as reactive ion etch or laser etch, or an isotropic etch, such as a wet chemical etch.

Following formation of the hard mask 9, the exposed portions of the material layer 8' for the extrinsic base region 8 may be etched, i.e., removed, to expose an upper surface of the underlying germanium containing, silicon containing or type III-V semiconductor material 5' for the base region 5. In one embodiment, the etch process for etching the material layer 8' for the extrinsic base region 8 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the material layer 8' for the extrinsic base region 8 is reactive ion etching (RIE). The etch process may be timed until the upper surface of the underlying germanium containing, silicon containing or type III-V semiconductor material 5' for the base region 5 is exposed.

Figure 6:
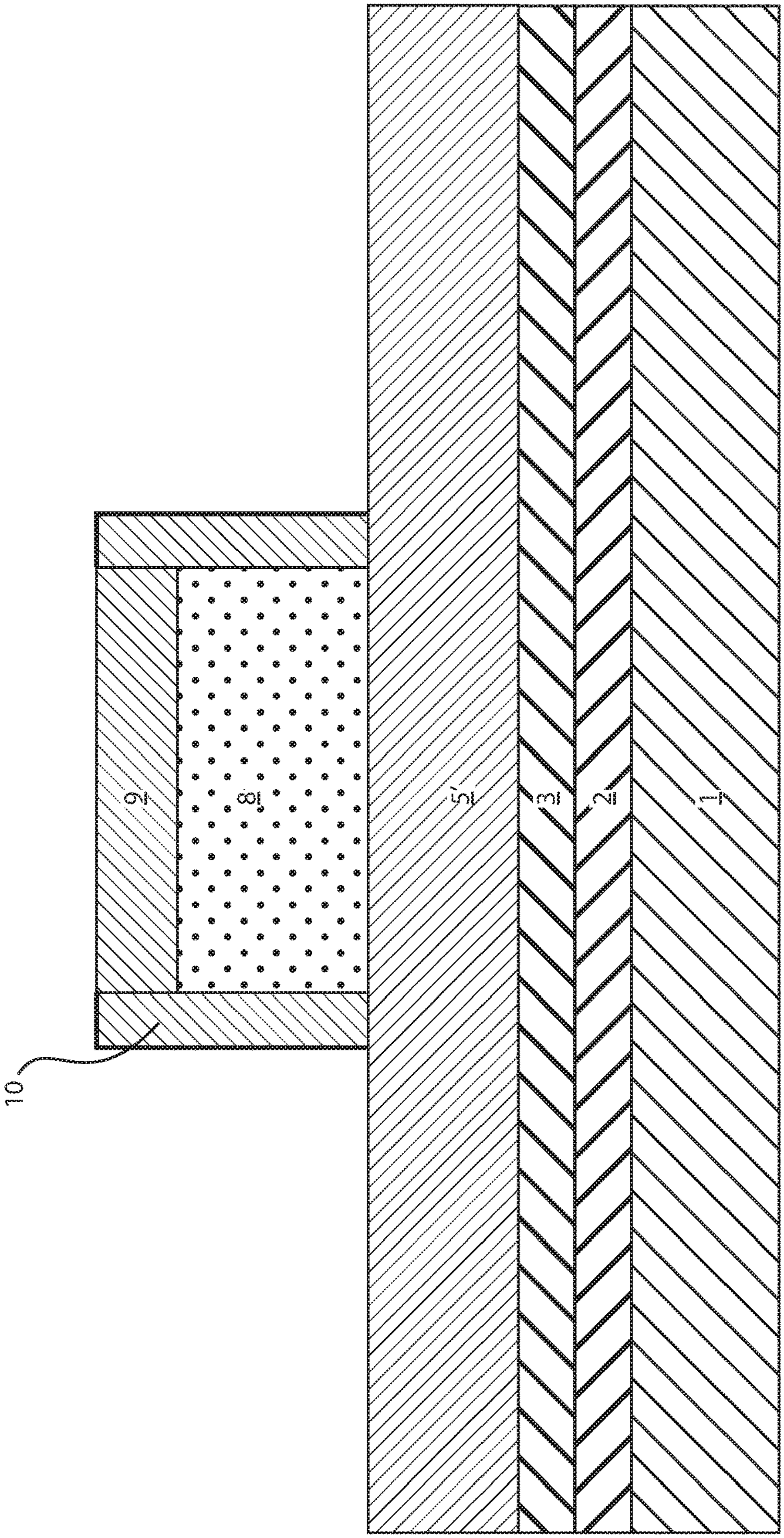
FIG. 6 is a side cross-sectional view depicting forming a spacer on the extrinsic base region, in accordance with one embodiment of the present disclosure.

FIG. 6 depicts one embodiment of forming a spacer 10 on the sidewalls of the extrinsic base region 8. The spacer 10 may include a dielectric material such as silicon oxide, silicon nitride, silicon oxynitride, organosilicate glass, or a combination thereof. The spacer 10 can be formed, for example, by conformal deposition of a dielectric material layer and subsequent anisotropic etch that removes the horizontal portions of the deposited dielectric material layer. The term "conformal layer" denotes a layer having a thickness that does not deviate from greater than or less than 30% of an average value for the thickness of the layer. The conformal deposition of the dielectric material layer can be performed, for example, by chemical vapor deposition (CVD), atomic layer deposition (ALD), or a combination thereof. The etch process may be reactive ion etching (RIE) or laser etching.

Figure 7:
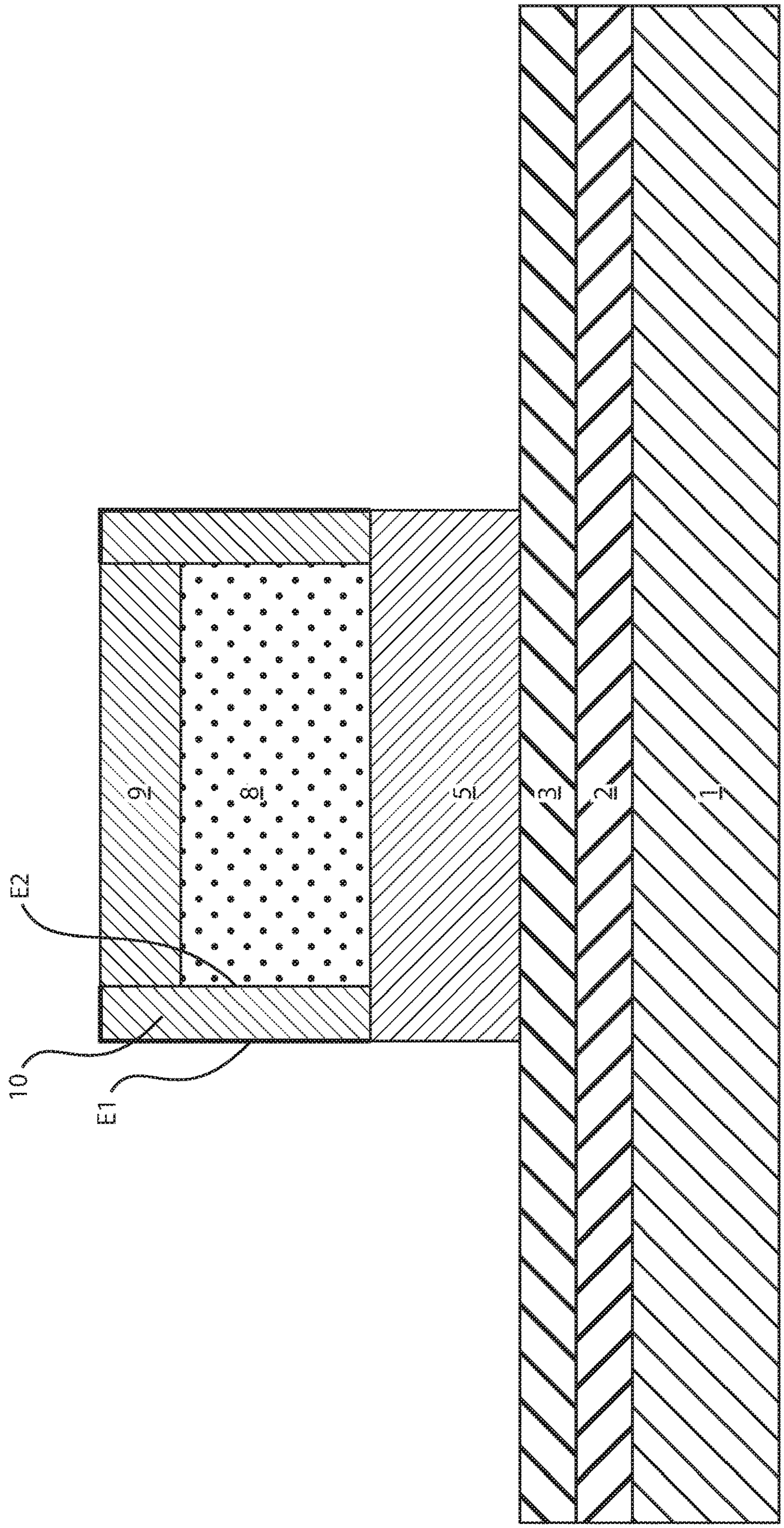
FIG. 7 is a side cross-sectional view depicted etching the germanium containing layer for providing a base region for the lateral bipolar junction transistor (LBJT) device, wherein the etch step stops on the crystalline oxide layer, in accordance with one embodiment of the present disclosure.

FIG. 7 depicts etching the germanium containing or type III-V semiconductor material 5' for providing a base region 5 for the LBJT device selectively to the crystalline oxide layer 3. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

The etch process depicted in FIG. 7 patterns the base region 5 from the germanium containing, silicon containing or type III-V semiconductor material 5'. The exposed portions of the germanium containing or type III-V semiconductor material 5' may be removed while the portions of the germanium containing or type III-V semiconductor material 5' underlying the spacer 10, and the hardmask 9 are protected from being removed by the etch. The etch process for removing the exposed portions of the germanium containing, silicon containing or type III-V semiconductor material 5' may be a wet etch or a dry etch, such as reactive ion etch. The etch process for etching the germanium containing or type III-V semiconductor material 5' may be selective to the dielectric spacer 10, the hardmask 9 and the underlying crystalline oxide layer 3.

Figure 8:
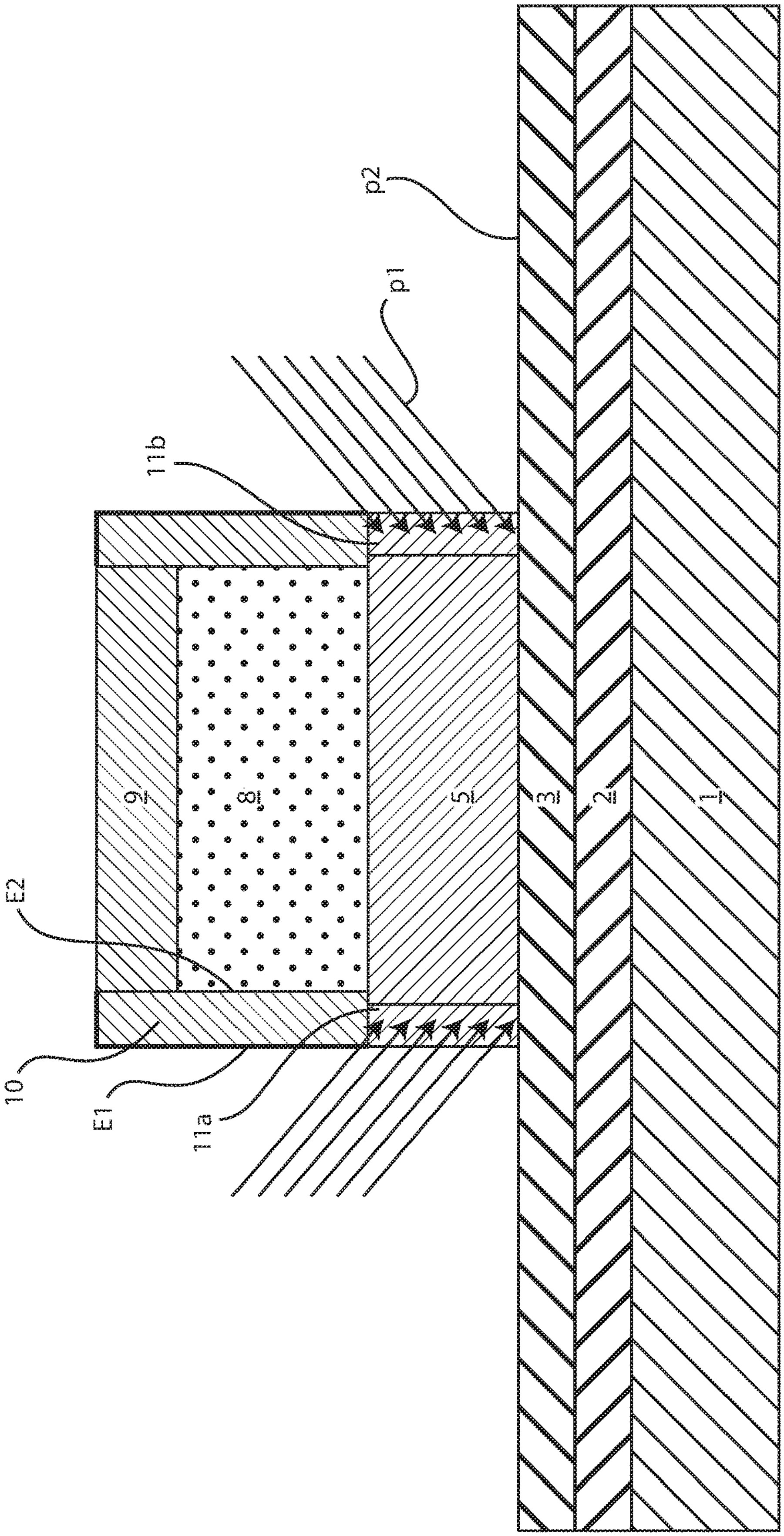
FIG. 8 is a side cross-sectional view depicting one embodiment of forming emitter and collector extension regions, i.e., junctions, on opposing sides of the base region, in accordance with one embodiment of the present disclosure.

FIG. 8 depicts one embodiment of forming emitter and collector extension regions 11*a*, 11*b*, e.g., abrupt extension regions 11*a*, 11*b*, on opposing sides of the base region 5. The emitter and collector extension regions 11*a*, 11*b*, i.e., the emitter and collector p-n junctions with the base region 5, may be formed using an angled ion implant and an anneal process. The extension regions 11*a*, 11*b* are doped to a conductivity type that is opposite the conductivity type of the base region 5. For example, if the base region 5 has an n-type conductivity, the extension regions 11*a*, 11*b* are doped to a p-type conductivity. In another example, if the base region 5 has a p-type conductivity, the extension regions 11*a*, 11*b* are doped to an n-type conductivity.

The term "p-type" refers to the addition of impurities to an intrinsic semiconductor that creates deficiencies of valence electrons. As used herein, "n-type" refers to the addition of impurities that contributes free electrons to an intrinsic semiconductor. In the embodiments, in which the base region 5 is composed of a type IV semiconductor material, such as silicon, polysilicon, germanium (Ge), or silicon germanium (SiGe), polysilicon germanium, examples of n-type dopants may include antimony, arsenic and phosphorous, and examples of p-type dopants may include boron, aluminum, gallium and indium. To provide an n-type dopant to the III-V semiconductor material, the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, to provide abrupt junctions in a base region 5 composed of a type III-V semiconductor material, the dopants that dictate the n-type or p-type conductivity may include silicon (Si), iron (Fe), germanium (Ge) and combinations thereof.

The dopants for the emitter and collector extension regions 11*a*, 11*b*, e.g., abrupt extension regions 11*a*,11*b*, are introduced by angled ion implantation, and extend beneath the outside edge E1 of the spacer 10, but not extend in a significant amount, i.e., concentration, beyond the outside edge E2 of the spacer 10. Angled ion implantation as used throughout the instant application denotes that dopants are implanted towards the surface of the exposed sidewall surface of the base region 5 along a plane P1 that forms an acute angle $\alpha$ when intersecting with the plane P2 that is substantially parallel to the upper surface of the crystalline oxide layer 3. The angled ion implantation may include an angle $\alpha$ ranging from 3° to 75°. In another embodiment, the angled ion implantation includes an angle $\alpha$ ranging from 5° to 60°. In yet another embodiment, the angled ion implantation includes an angle $\alpha$ ranging from 15° to 45°.

Following the angled ion implantation, the structure may be annealed with a low temperature junction anneal. The anneal may be conducted by furnace, rapid thermal anneal (RTA) or laser anneal. The temperature of the anneal process may range from 400° C. to 600° C., in which the time and temperature of the anneal is selected to avoid excess diffusion of the dopant from the extension regions 11 with the base region 5, so as to maintain the abrupt characterization of the dopant distribution in the extension regions 11.

In a following process step, the emitter and collector regions 12, 13 of the LBJT device are formed by epitaxial deposition to provide the structure depicted in FIGS. 1A and 1B. The emitter and collector regions 12, 13 are typically composed of polycrystalline or single crystalline semiconductor material having a larger band gap than the base region. The term "single crystalline" denotes a crystalline solid, in which the crystal lattice of the entire sample is substantially continuous and substantially unbroken to the edges of the sample, with substantially no grain boundaries. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns).

The single crystalline or polycrystalline semiconductor material that provides the emitter region 12 and the collector region 13 may be a type IV semiconductor material, such as germanium (Ge), silicon germanium (Ge), or silicon (Si). Silicon (Si) and silicon germanium (SiGe) are acceptable semiconductor material for the emitter and collector region 12, 13 in devices including a germanium-containing base 5, e.g., a base region 5 of germanium (Ge). In other embodiments, the single crystalline or polycrystalline semiconductor material that provides the emitter region 12 and the collector region 13 may be a type III-V semiconductor, such as indium gallium arsenide (InGaAs). Typically, in some embodiments, when the base region is composed of a III-V semiconductor material, the emitter region 12 and collector region 13 are also composed of a III-V semiconductor material, and the band gap of the emitter and collector region 12, 13 can be equal to or larger than the band gap of the base region 5. The composition of the semiconductor material that provides the emitter region 12 and the collector region 13 may be selected to have a band gap that is equal to or greater than the base region 5. For example, when the base region 5 is composed of germanium (Ge) that is p-type doped, the emitter and collector region 12, 13 may be composed of n-type silicon germanium (SiGe), in which silicon germanium (SiGe) has a greater band gap than germanium (Ge).

The polycrystalline or single crystalline semiconductor material is grown, e.g., by epitaxial growth, on the crystalline oxide layer 3. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface, e.g., the crystalline oxide of $HfO_2$, the epitaxial film will take on a {100} orientation. The epitaxial deposition process may be carried out in the deposition chamber of a chemical vapor deposition (CVD) apparatus. The temperature for epitaxial deposition typically ranges from 550° C. to 900° C. Although higher temperature typically results in faster deposition, the faster deposition may result in crystal defects and film cracking.

A number of different sources may be used for the deposition of the semiconductor material for the emitter and collector region 12, 13. In some embodiments, in which the emitter and collector region are composed of germanium, the germanium gas source may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the emitter and collector regions 12, 13 is composed of silicon germanium, the silicon sources for deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

In some embodiments, the deposition process for forming the semiconductor material of the emitter and collector regions 12, 13 may continue until the thickness of the deposited material extends above the upper surface of the base region 5. The emitter and collector regions 12, 13 are doped with a conductivity type dopant that is opposite the conductivity type of the base region 5. The emitter and collector regions 12, 13 are doped with a conductivity type dopant that is the same conductivity type as the emitter and collector extension regions 11*a*, 11*b*, e.g., abrupt junctions 11*a*, 11*b*. The dopant concentration of the epitaxially formed in-situ doped single crystal or polycrystalline semiconductor material that provides the emitter and collector regions 12, 13 is less than the dopant concentration of the emitter and collector extension regions 11*a*, 11*b*. In one example, the dopant concentration of the emitter and collector regions 12, 13 may range from $5\times10^{19}$ atoms/cm$^3$ to $1\times10^{21}$ atoms/cm$^3$. In another example, the dopant concentration of the emitter and collector regions 12, 13 may range from $2\times10^{19}$ atoms/cm$^3$ to $5\times10^{19}$ atoms/cm$^3$.

In some embodiments, selective epitaxial growth of in-situ doped poly-silicon or poly-silicon germanium for the emitter and collector regions 12, 13 may be facetted as depicted in FIG. 1A, or the selective epitaxial growth of in-situ doped poly-silicon or poly-silicon germanium for the emitter and collector regions 12, 13, may be non-facetted. By selective, it is meant that the epitaxial material grow on the exposed sidewall surface of the base region 5, i.e., junctions 11*a*, 11*b*, and the crystalline oxide layer 3, but the epitaxial material will not be formed on the hardmask 9 and the dielectric spacers 10.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A lateral bipolar junction transistor (LBJT) device comprising:

a crystalline oxide layer that is selected from the group consisting of cerium oxide ($CeO_2$), lanthanum oxide ($La_2O_3$), yttrium oxide ($Y_2O_3$), gadolinium oxide ($Gd_2O_3$), terbium oxide ($Tb_2O_3$) and combinations thereof;

a base region comprised of a germanium containing material in bonded engagement to the crystalline oxide layer;

an extrinsic base region formed on the germanium containing material; and an emitter region and collector region present on opposing sides of the base region, wherein the emitter region and the collector region are in direct contact with the crystalline oxide layer, the emitter and collector region having a crystal lattice substantially matched to the crystalline oxide layer.

2. The lateral bipolar junction transistor (LBJT) of claim 1, comprising a junction region between each of the emitter region and the collector region and the base region, wherein the junction region has a dopant conductivity type equal to the dopant conductivity type of the emitter and the collector region, wherein a vertical dopant concentration in said junction region is substantially uniform.

3. The lateral bipolar junction transistor (LBJT) of claim 2, wherein a dopant concentration in said junction ranges from $1\times10^{19}$ $cm^{-3}$ to $1\times10^{21}$ $cm^{-3}$.

4. The lateral bipolar junction transistor (LBJT) of claim 3, wherein the emitter region and collector region are composed of non-facetted semiconductor material.

5. The lateral bipolar junction transistor (LBJT) of claim 4, wherein the emitter and collector region are comprised of an epitaxial semiconductor selected from the group consisting of polysilicon, polysilicon germanium and a combination thereof.

6. The lateral bipolar junction transistor (LBJT) device of claim 1, further comprising an extrinsic base region comprised of a semiconductor selected from the group consisting of doped polycrystalline silicon germanium and doped polycrystalline silicon, wherein a dopant concentration that provides a conductivity type of the extrinsic base region is greater than a dopant concentration that provides a conductivity type of the base region.

* * * * *